(12) United States Patent
Yokoyama et al.

(10) Patent No.: US 11,482,548 B2
(45) Date of Patent: Oct. 25, 2022

(54) SEMICONDUCTOR DEVICE AND IMAGING UNIT

(71) Applicant: SONY SEMICONDUCTOR SOLUTIONS CORPORATION, Kanagawa (JP)

(72) Inventors: Takashi Yokoyama, Kanagawa (JP); Mikio Oka, Kanagawa (JP); Yasuo Kanda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 18 days.

(21) Appl. No.: 16/976,738

(22) PCT Filed: Feb. 7, 2019

(86) PCT No.: PCT/JP2019/004430
§ 371 (c)(1),
(2) Date: Aug. 28, 2020

(87) PCT Pub. No.: WO2019/171872
PCT Pub. Date: Sep. 12, 2019

(65) Prior Publication Data
US 2021/0043663 A1    Feb. 11, 2021

(30) Foreign Application Priority Data

Mar. 6, 2018  (JP) .............................. JP2018-039217

(51) Int. Cl.
*H01L 27/146*    (2006.01)
(52) U.S. Cl.
CPC ...... *H01L 27/1461* (2013.01); *H01L 27/1462* (2013.01); *H01L 27/14627* (2013.01)
(58) Field of Classification Search
CPC ............. H01L 27/1461; H01L 27/1462; H01L 27/14627; H01L 23/481; H01L 27/14612;
(Continued)

(56) References Cited

U.S. PATENT DOCUMENTS

2007/0195586 A1    8/2007    Kim et al.
2010/0181547 A1*   7/2010    Kuroda ............... H01L 27/2436
                                                    257/2
(Continued)

FOREIGN PATENT DOCUMENTS

CN    101026176 A    8/2007
CN    102738168 A    10/2012
(Continued)

OTHER PUBLICATIONS

International Search Report and Written Opinion of PCT Application No. PCT/JP2019/004430, dated Apr. 9, 2019, 12 pages of ISRWO.

*Primary Examiner* — Jonathan Han
(74) *Attorney, Agent, or Firm* — Chip Law Group

(57) ABSTRACT

Provided is a semiconductor device having a structure suitable for higher integration. The semiconductor device includes a transistor that includes a gate section, a first diffusion layer, and a second diffusion layer. The semiconductor device further includes a first electrically-conductive section a second electrically-conductive section that is electrically insulated from the first electrically-conductive section, a first storage element that is located between the first diffusion layer and the first electrically-conductive section and is electrically coupled to each of the first diffusion layer and the first electrically-conductive section, and a second storage element that is located between the second diffusion layer and the second electrically-conductive section and is electrically coupled to each of the second diffusion layer and the second electrically-conductive section.

13 Claims, 15 Drawing Sheets

(58) Field of Classification Search
CPC ............ H01L 27/14634; H01L 27/228; H01L 27/14636; H01L 43/08
See application file for complete search history.

(56) References Cited

U.S. PATENT DOCUMENTS

| | | | |
|---|---|---|---|
| 2012/0248544 A1 | 10/2012 | Yokoyama | |
| 2013/0058162 A1 | 3/2013 | Yamanaka et al. | |
| 2015/0060967 A1* | 3/2015 | Yokoyama | ............ H01L 23/481 |
| | | | 257/292 |
| 2015/0061020 A1* | 3/2015 | Yokoyama | .............. H01L 43/10 |
| | | | 257/347 |
| 2015/0380463 A1* | 12/2015 | Yokoyama | ............ H01L 27/228 |
| | | | 257/4 |
| 2016/0181509 A1* | 6/2016 | Shin | ........................ H01L 43/12 |
| | | | 438/3 |
| 2018/0240797 A1 | 8/2018 | Yokoyama et al. | |

FOREIGN PATENT DOCUMENTS

| | | |
|---|---|---|
| CN | 102983148 A | 3/2013 |
| CN | 107924873 A | 4/2018 |
| EP | 1826772 A1 | 8/2007 |
| JP | 2007-227917 A | 9/2007 |
| JP | 2009-151885 A | 7/2009 |
| JP | 2012-216776 A | 11/2012 |
| JP | 2013-058521 A | 3/2013 |
| KR | 10-2007-0084810 A | 8/2007 |
| KR | 10-2018-0048613 A | 5/2018 |
| TW | 201312561 A | 3/2013 |
| WO | 2007/066407 A1 | 6/2007 |
| WO | 2017/038403 A1 | 3/2017 |

\* cited by examiner

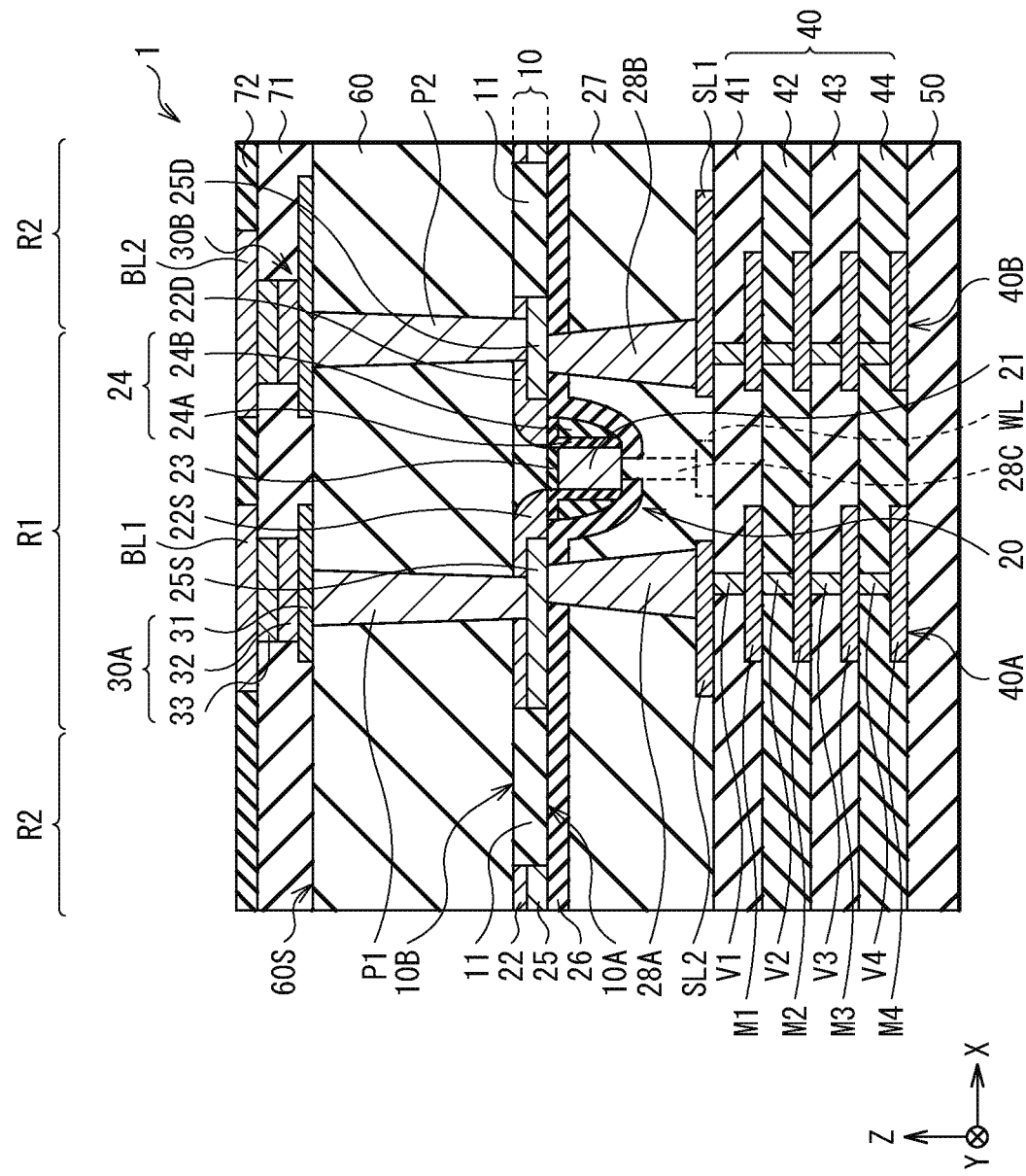
[FIG. 1A]

[FIG. 1B]
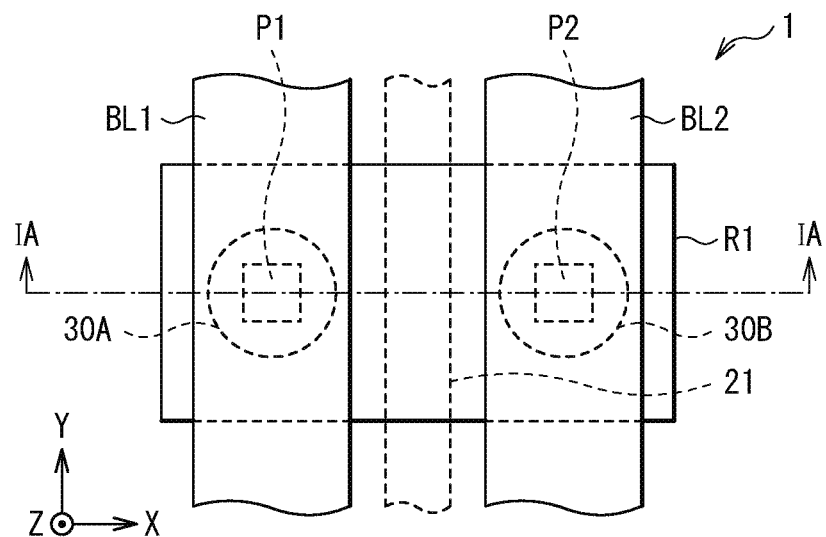
[FIG. 1C]
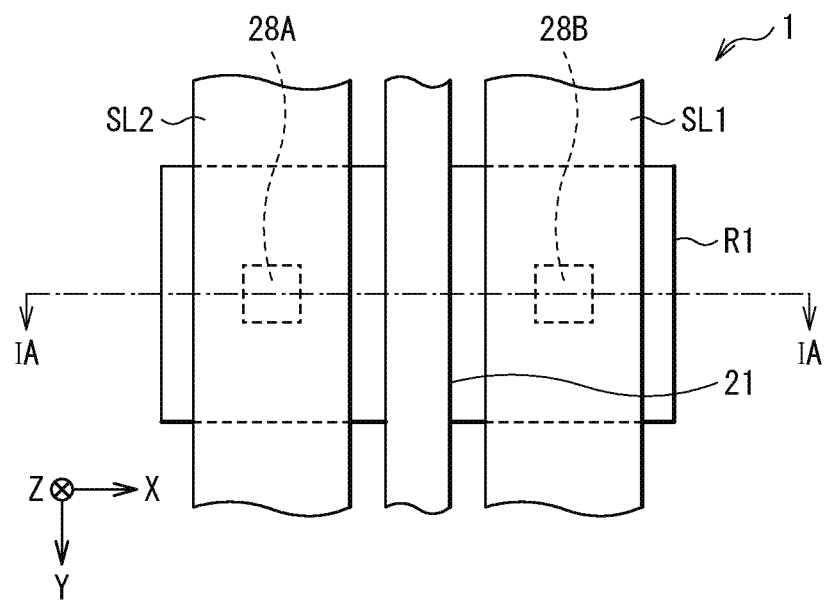

[FIG. 1D]
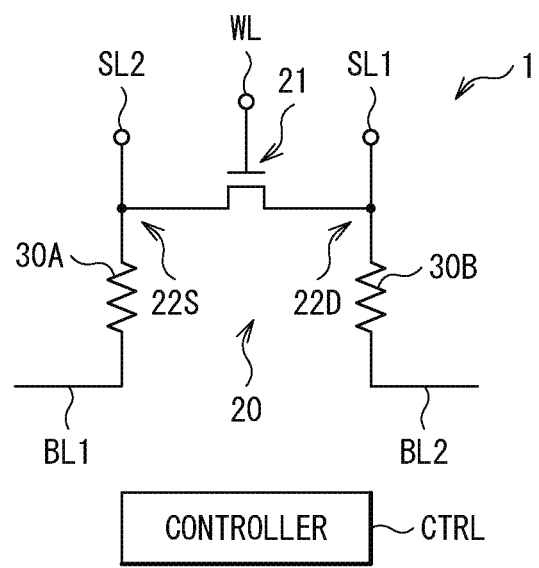

[FIG. 2]
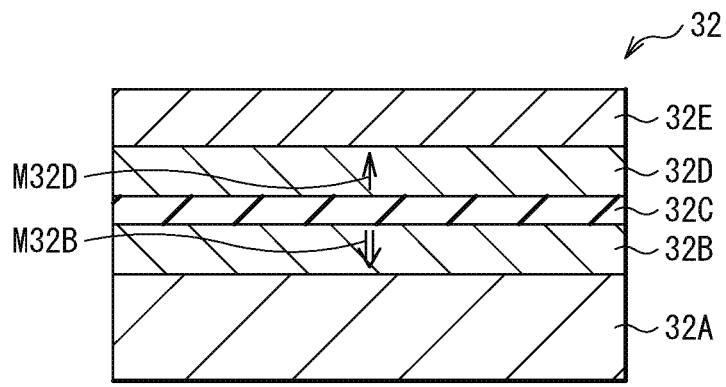
[FIG. 3]
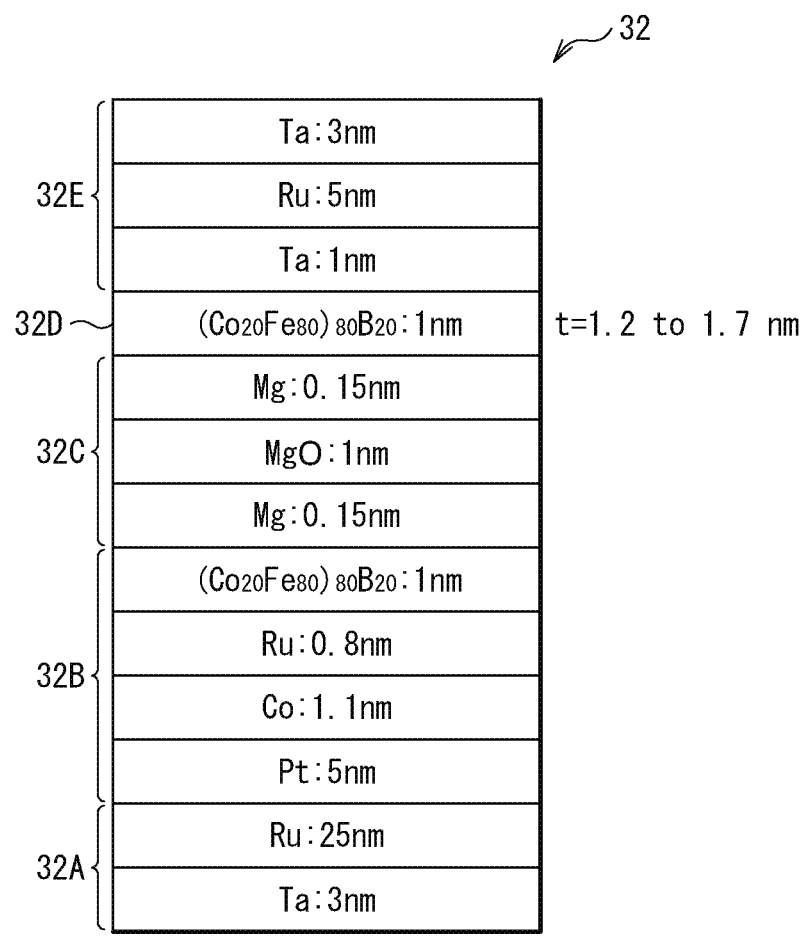

[FIG. 4A]
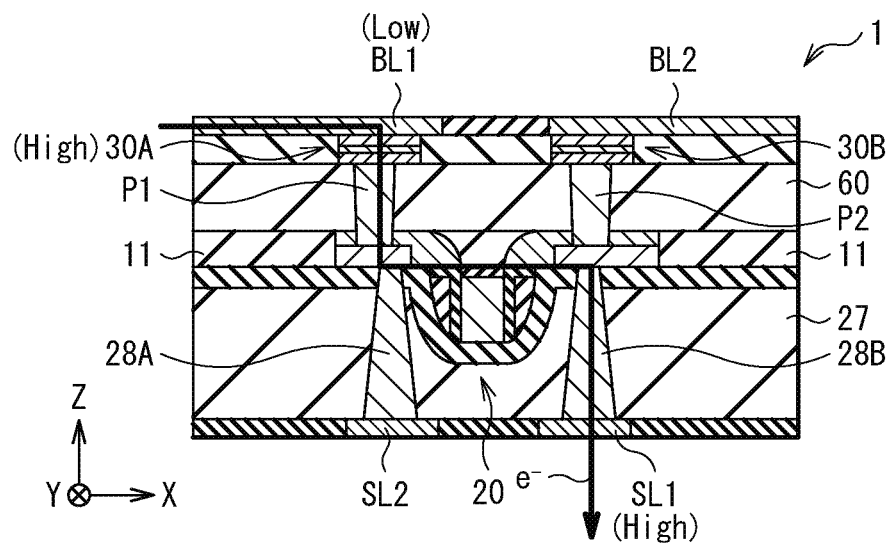
[FIG. 4B]
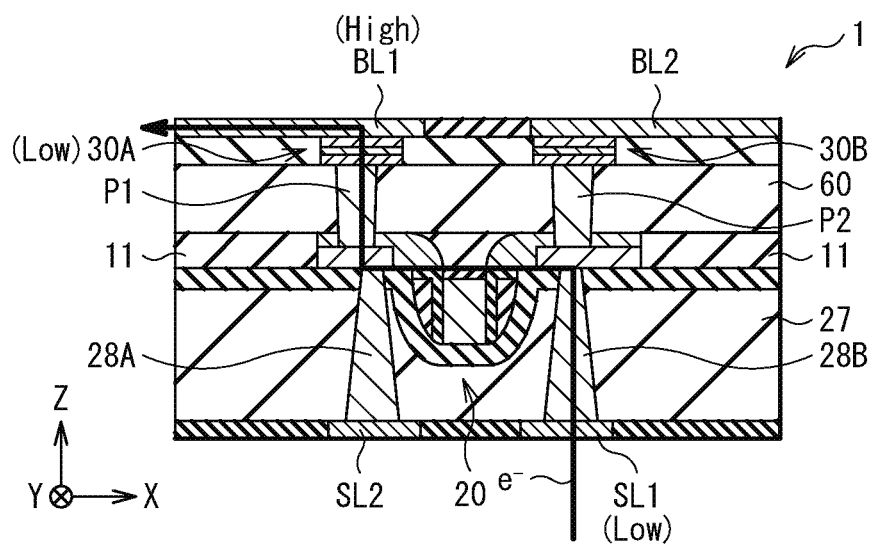

[FIG. 4C]
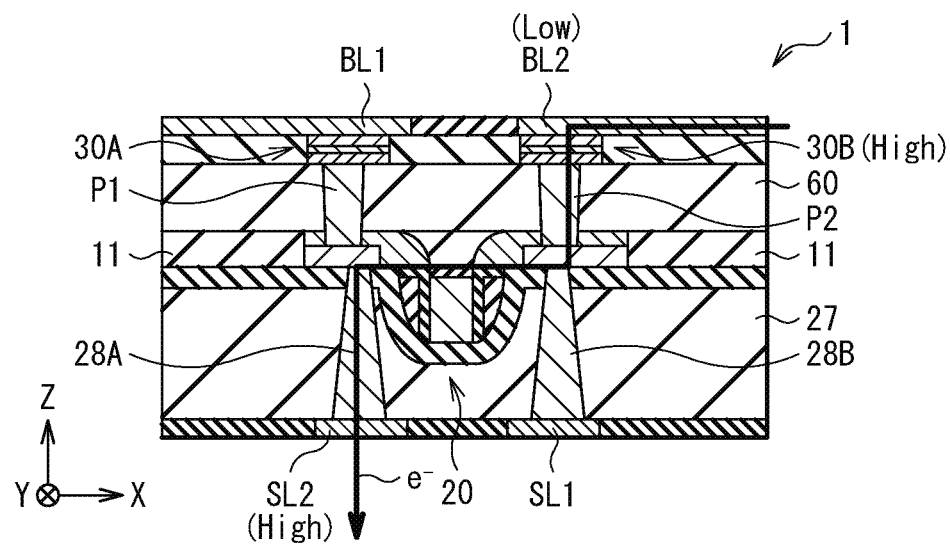
[FIG. 4D]
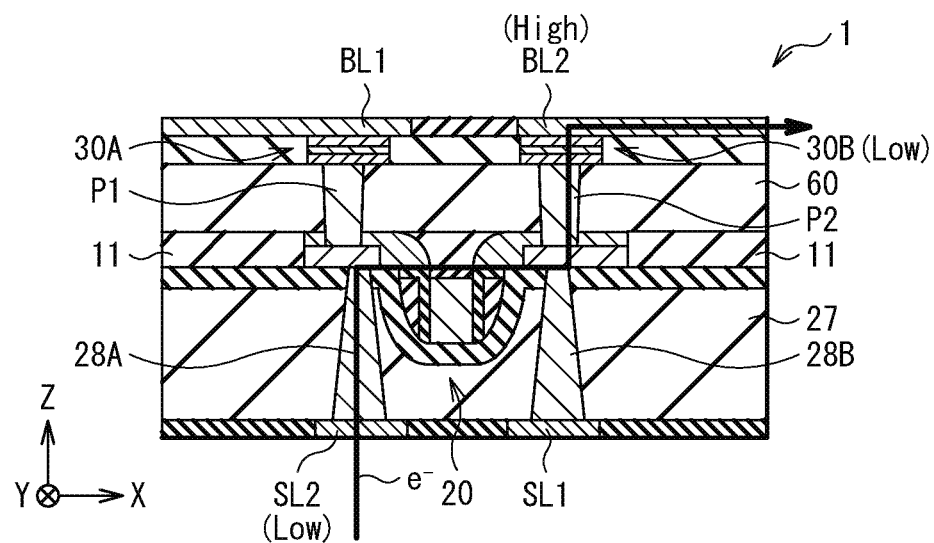

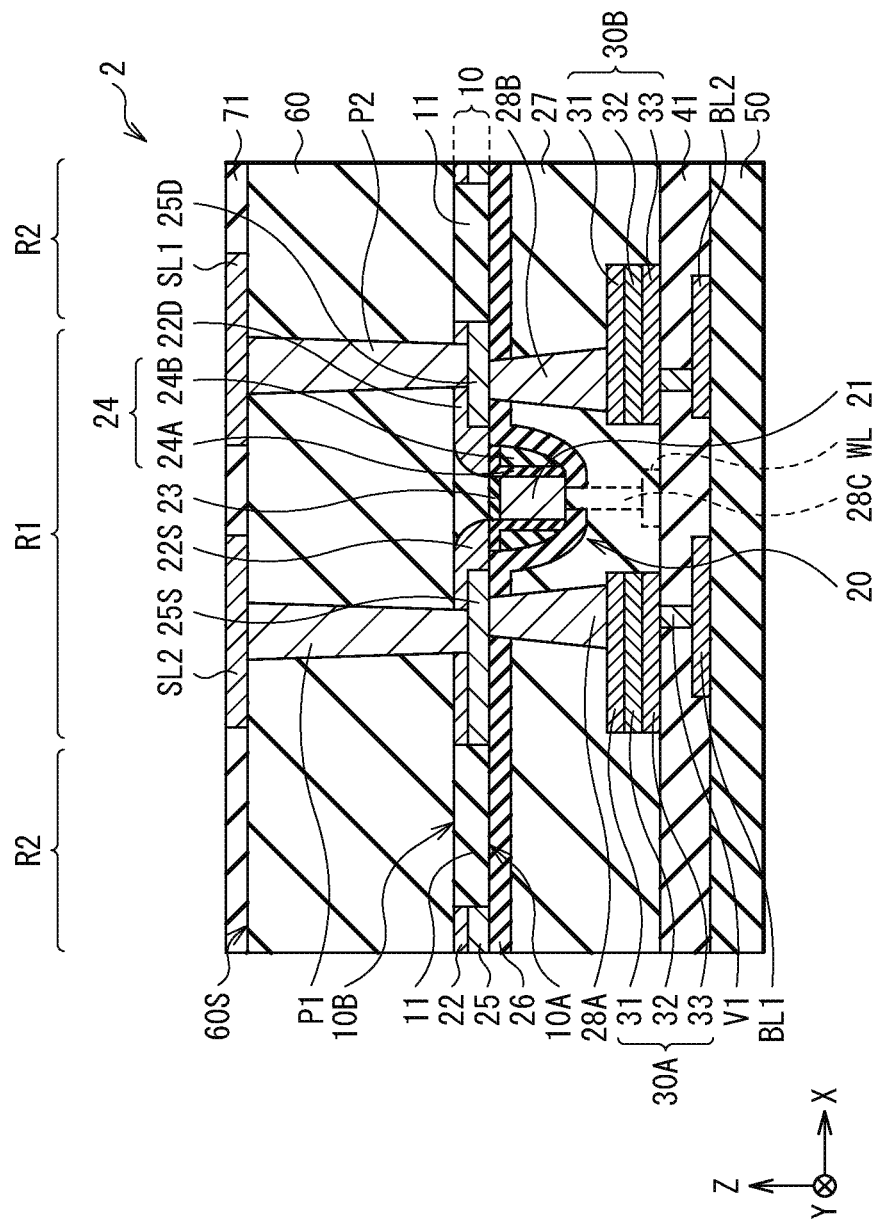
[FIG. 5A]

[FIG. 5B]
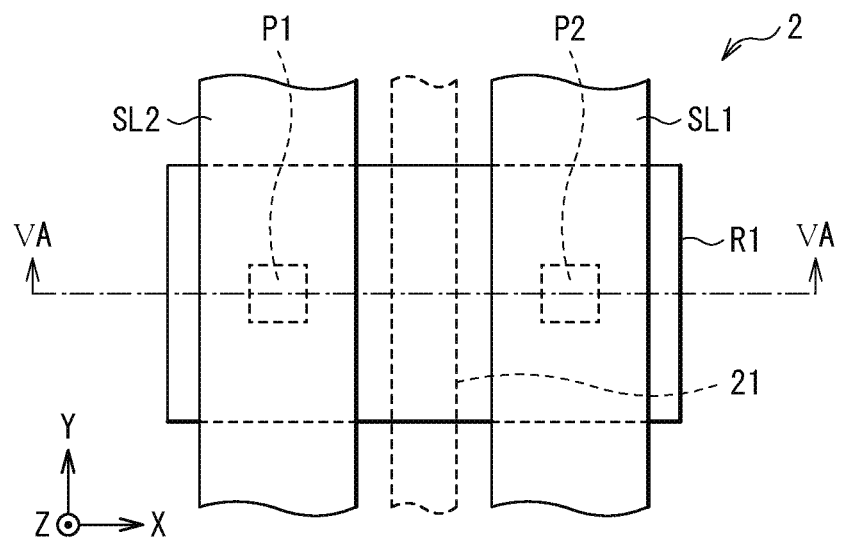
[FIG. 5C]
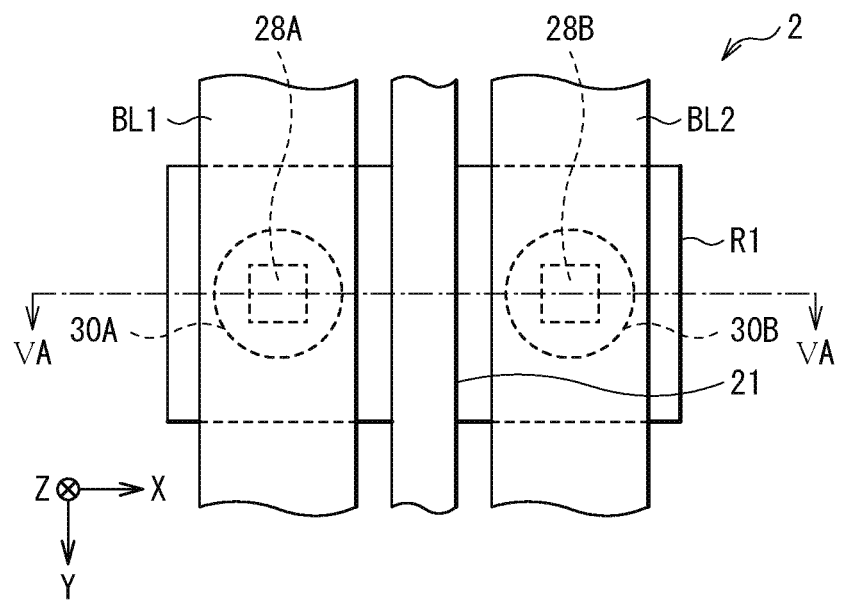

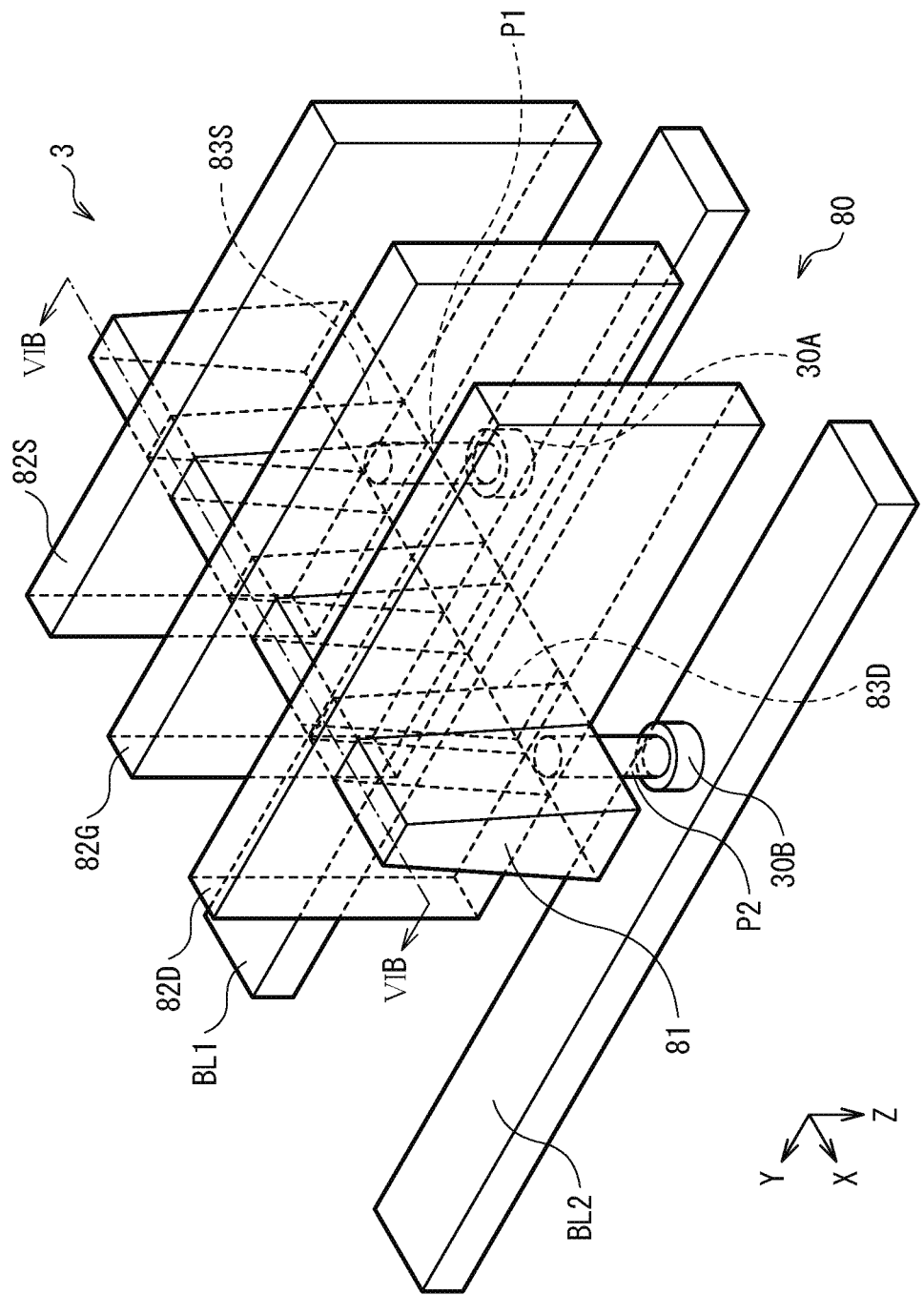
[FIG. 6A]

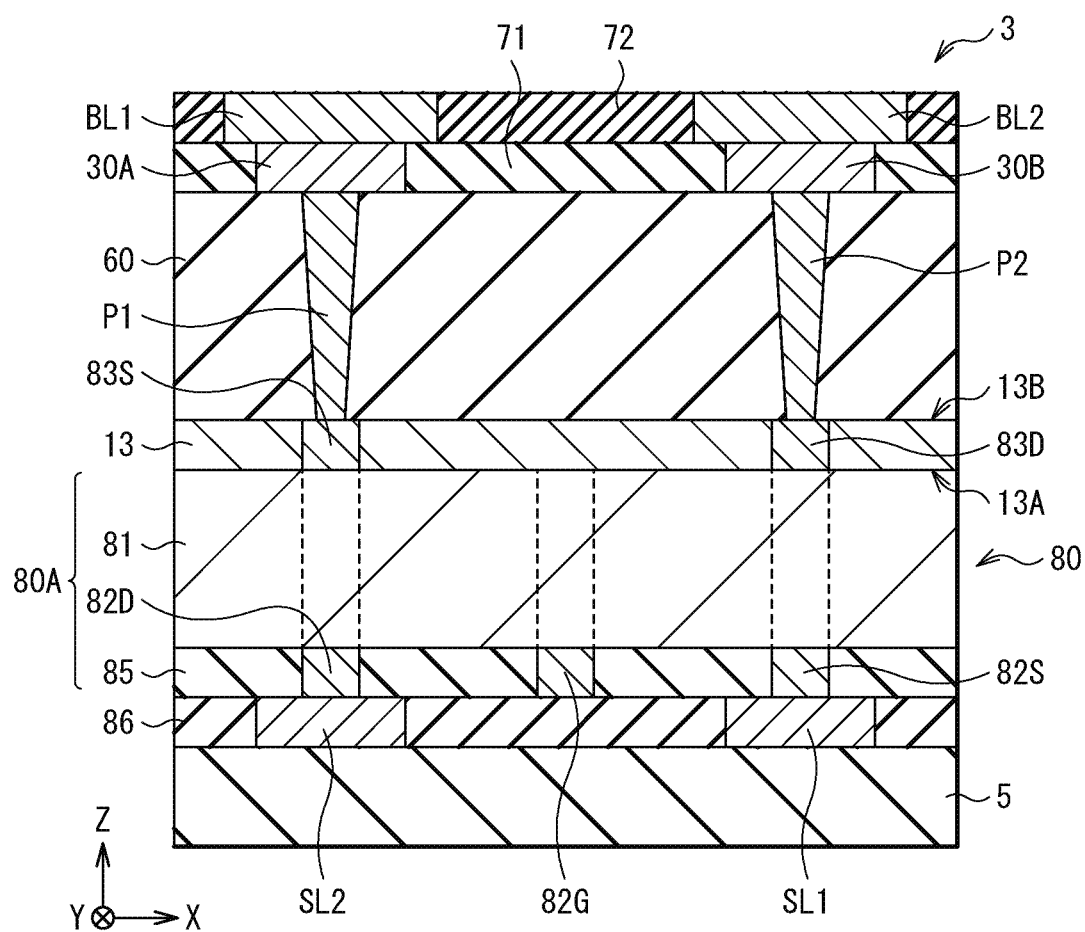
[FIG. 6B]

[FIG. 6C]
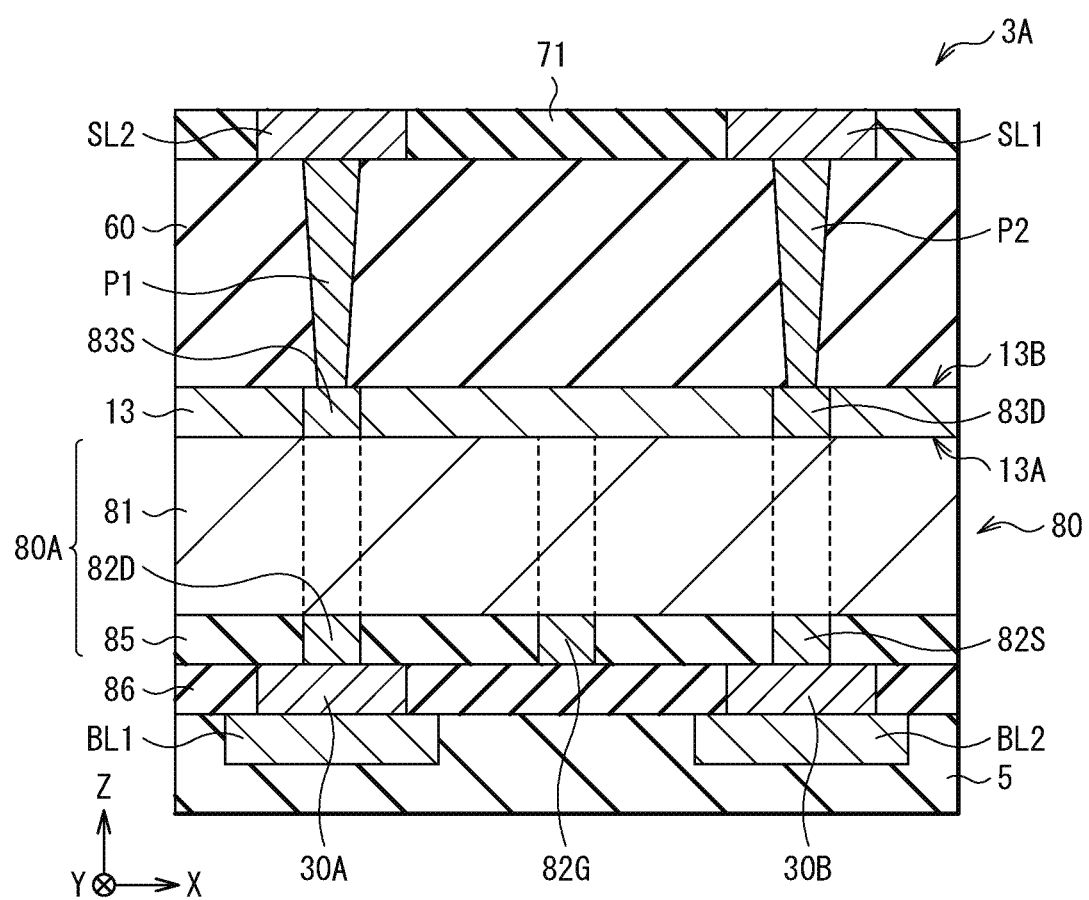

[FIG. 7A]
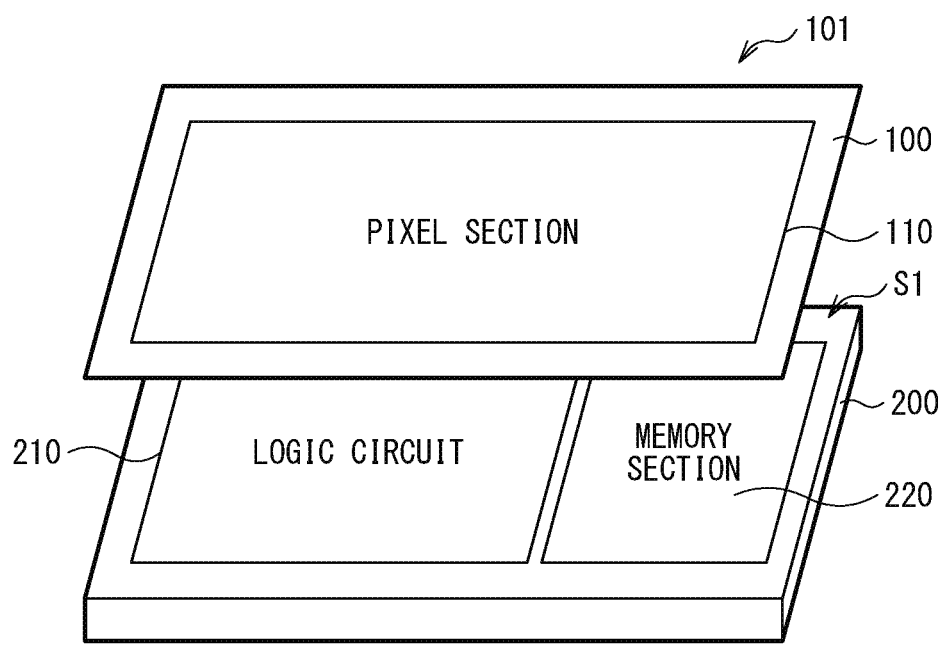

[FIG. 7B]
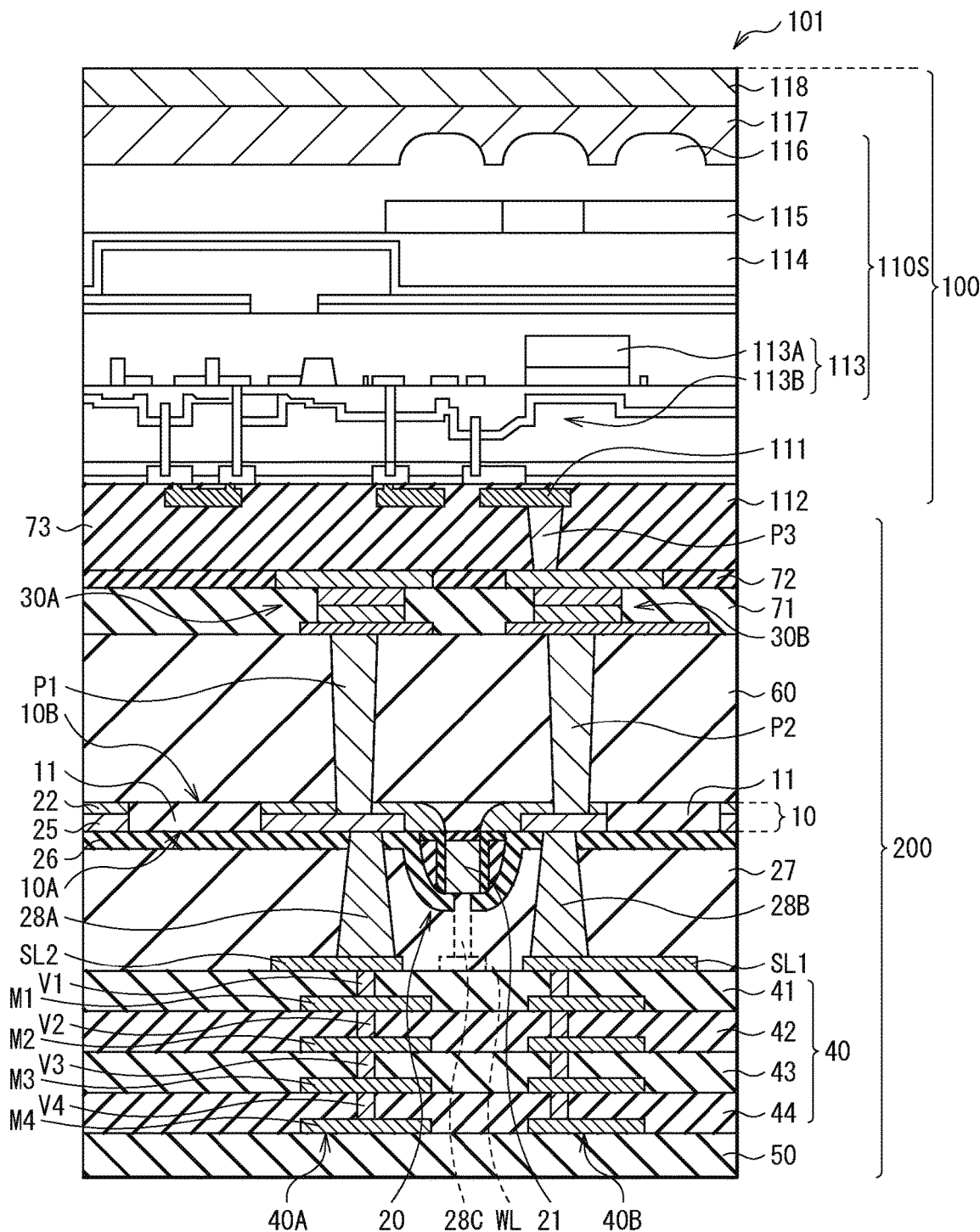

[FIG. 8A]
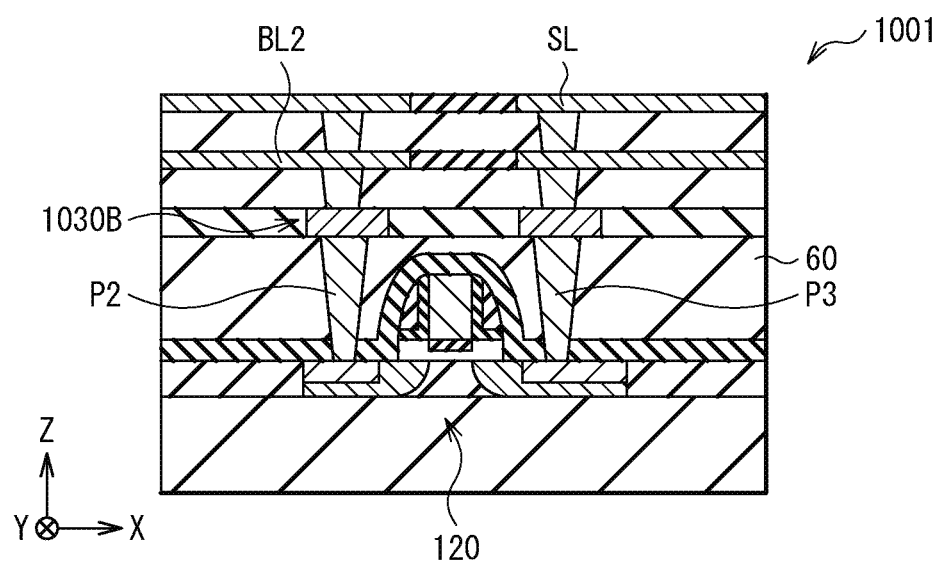
[FIG. 8B]
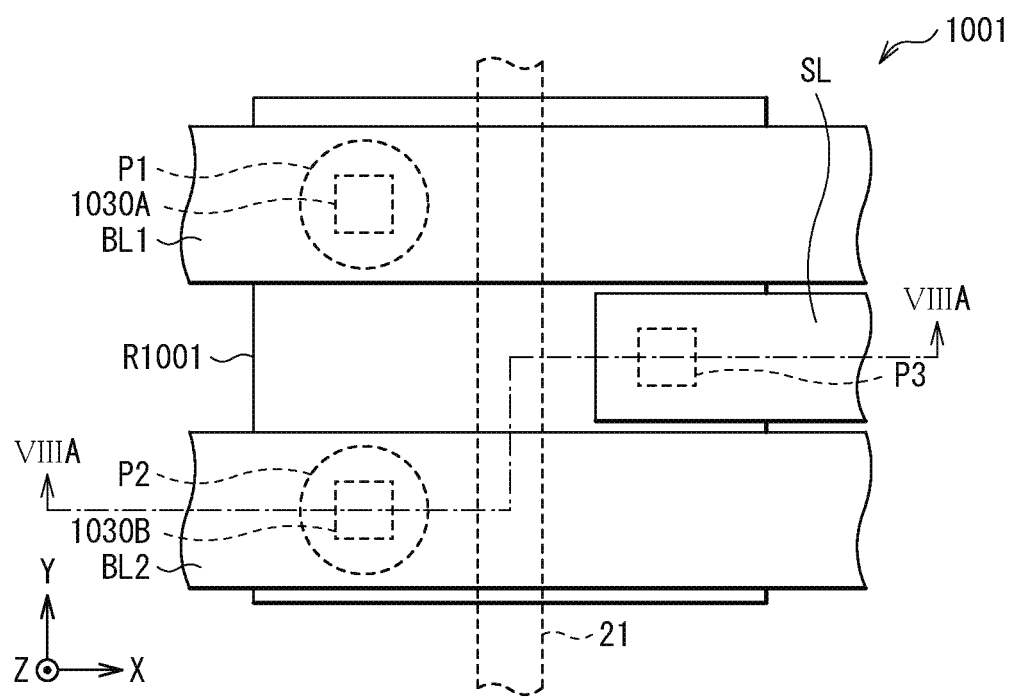

[FIG. 9A]
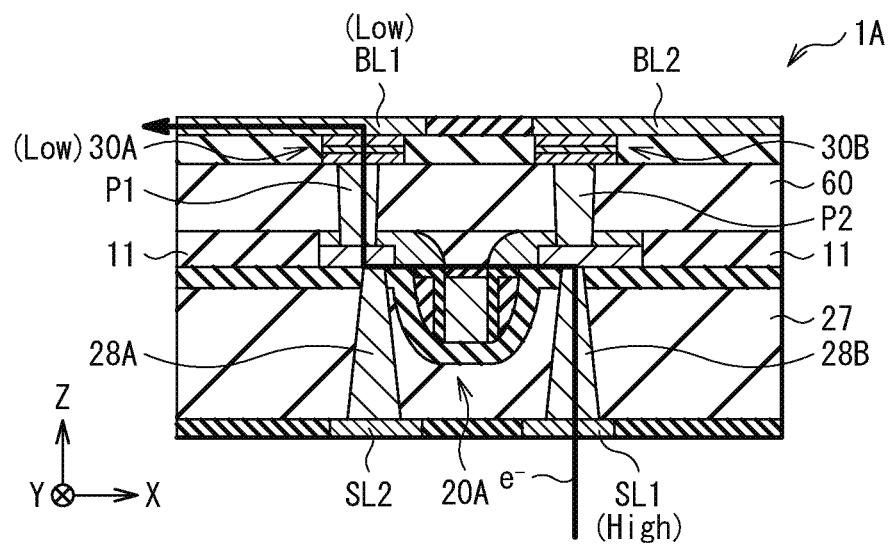
[FIG. 9B]
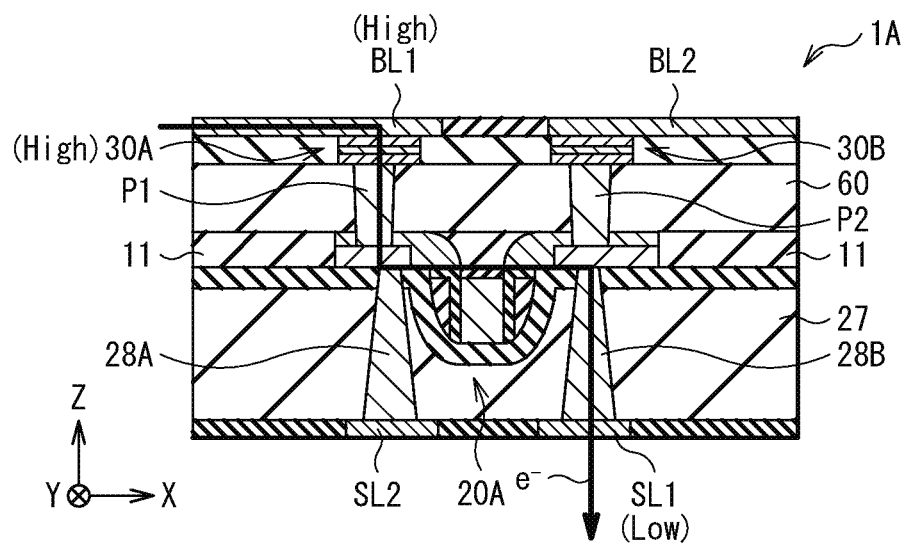

SEMICONDUCTOR DEVICE AND IMAGING UNIT

CROSS REFERENCE TO RELATED APPLICATIONS

This application is a U.S. National Phase of International Patent Application No. PCT/JP2019/004430 filed on Feb. 7, 2019, which claims priority benefit of Japanese Patent Application No. JP 2018-039217 filed in the Japan Patent Office on Mar. 6, 2018. Each of the above-referenced applications is hereby incorporated herein by reference in its entirety.

TECHNICAL FIELD

The present disclosure relates to a semiconductor device including a transistor and a storage element, and to an imaging unit including the semiconductor device.

BACKGROUND ART

For a semiconductor integrated circuit including a CMOS (Complementary Metal Oxide Semiconductor) transistor, higher integration and higher operating speed thereof have been studied. In recent years, from a viewpoint of lower power consumption, switching from a volatile memory to a non-volatile memory has been studied and, for example, the development of an MRAM (Magnetoresistive Random Access Memory) has been promoted (see, for example, PTL 1).

CITATION LIST

Patent Literature

PTL 1: International Publication No. WO 2007/066407

SUMMARY OF THE INVENTION

Incidentally, a semiconductor device including such a semiconductor integrated circuit is expected to be more highly integrated. Therefore, it is desirable to provide a semiconductor device having a structure suitable for higher integration, and an imaging unit including the semiconductor device.

A semiconductor device as an embodiment of the present disclosure includes: a transistor including a gate section, a source section, and a drain section; a first electrically-conductive section; a second electrically-conductive section that is electrically insulated from the first electrically-conductive section; a first storage element that is located between the source section and the first electrically-conductive section and is electrically coupled to each of the source section and the first electrically-conductive section; and a second storage element that is located between the drain section and the second electrically-conductive section and is electrically coupled to each of the drain section and the second electrically-conductive section. Furthermore, an imaging unit as an embodiment of the present disclosure includes the above-described semiconductor device.

In the semiconductor device and the imaging unit as the embodiments of the present disclosure, the first storage element is coupled to the source section of the transistor, and the second storage element is coupled to the drain section of the transistor. Thus, the entire occupation area is smaller than in a case where both the first storage element and the second storage element are coupled to, for example, the source section.

The semiconductor device and the imaging unit as the embodiments of the present disclosure are suitable for higher integration. It is to be noted that the effects of the present disclosure are not limited to this, and may be any of effects described below.

BRIEF DESCRIPTION OF DRAWINGS

FIG. 1A is a cross-sectional diagram illustrating a configuration example of a semiconductor device according to a first embodiment of the present disclosure.

FIG. 1B is a planar diagram illustrating a configuration example of the semiconductor device illustrated in FIG. 1A.

FIG. 1C is another planar diagram illustrating the configuration example of the semiconductor device illustrated in FIG. 1A.

FIG. 1D is a circuit diagram of the semiconductor device illustrated in FIG. 1A.

FIG. 2 is a cross-sectional diagram illustrating an example of a configuration of a storage section of a storage element illustrated in FIG. 1A.

FIG. 3 is a cross-sectional diagram illustrating an example of a configuration of each layer of the storage section illustrated in FIG. 2.

FIG. 4A is an explanatory diagram that describes a method of writing first information into a first storage element of the semiconductor device illustrated in FIG. 1A.

FIG. 4B is an explanatory diagram that describes a method of writing second information into the first storage element of the semiconductor device illustrated in FIG. 1A.

FIG. 4C is an explanatory diagram that describes a method of writing the first information into a second storage element of the semiconductor device illustrated in FIG. 1A.

FIG. 4D is an explanatory diagram that describes a method of writing the second information into the second storage element of the semiconductor device illustrated in FIG. 1A.

FIG. 5A is a cross-sectional diagram illustrating a configuration example of a semiconductor device according to a second embodiment of the present disclosure.

FIG. 5B is a planar diagram illustrating the configuration example of the semiconductor device illustrated in FIG. 5A.

FIG. 5C is another planar diagram illustrating the configuration example of the semiconductor device illustrated in FIG. 5A.

FIG. 6A is a perspective diagram illustrating a configuration example of a semiconductor device according to a third embodiment of the present disclosure.

FIG. 6B is a cross-sectional diagram illustrating the configuration example of the semiconductor device illustrated in FIG. 6A.

FIG. 6C is a cross-sectional diagram illustrating a modification example of the semiconductor device illustrated in FIG. 6A.

FIG. 7A is a perspective diagram schematically illustrating an imaging unit as an application example that includes the semiconductor device of the present disclosure.

FIG. 7B is a cross-sectional diagram illustrating a configuration example of the imaging unit illustrated in FIG. 7A.

FIG. 8A is a cross-sectional diagram illustrating a configuration example of a semiconductor device as a reference example.

FIG. 8B is a planar diagram illustrating the semiconductor device as the reference example illustrated in FIG. 8A.

FIG. 9A is an explanatory diagram that describes a method of writing the second information into a first storage element of a semiconductor device as another modification example of the present disclosure.

FIG. 9B is an explanatory diagram that describes a method of writing the first information into the first storage element of the semiconductor device as the other modification example of the present disclosure.

MODES FOR CARRYING OUT THE INVENTION

In the following, embodiments of the present disclosure are described in detail with reference to the drawings. It is to be noted that description is given in the following order.
1. First Embodiment (A semiconductor device including two storage elements on a back surface side of a semiconductor substrate)
2. Second Embodiment (A semiconductor device including two storage elements on a front surface side of the semiconductor substrate)
3. Third Embodiment (A semiconductor device including two storage elements on a back surface side of a fin-shaped semiconductor layer)
4. Application Example (An imaging unit including a semiconductor device and a sensor device bonded together)
5. Other Modification Examples

1. First Embodiment

[Configuration of Semiconductor Device 1]

FIG. 1A illustrates a cross-sectional configuration of a semiconductor device 1 as a first embodiment of the present disclosure. Furthermore, both FIGS. 1B and 1C illustrate planar configurations of the semiconductor device 1. Note that FIG. 1B illustrates a planar configuration of the semiconductor device 1 when viewed from a main surface 10A side of a semiconductor substrate 10 to be described later, and FIG. 1C illustrates a planar configuration of the semiconductor device 1 when viewed from a back surface 10B side of the semiconductor substrate 10 to be described later. FIG. 1A corresponds to a cross-sectional view along a section line IA-IA illustrated in each of FIGS. 1B and 1C, as viewed in a direction of arrows. FIG. 1D is a circuit diagram of the semiconductor device 1.

As illustrated in FIGS. 1A, 1B, 1C, and 1D, the semiconductor device 1 includes a transistor 20, a bit line BL1 as a first electrically-conductive section, a bit line BL2 as a second electrically-conductive section that is electrically insulated from the bit line BL1, a storage element 30A as a first storage element, and a storage element 30B as a second storage element. The transistor 20 includes a gate electrode 21 as a gate section, a diffusion layer 22S as a source section, and a diffusion layer 22D as a drain section. The storage element 30A is located between the diffusion layer 22S and the bit line BL1, and is electrically coupled to each of the diffusion layer 22S and the bit line BL1. The storage element 30B is located between the diffusion layer 22D and the bit line BL2, and is electrically coupled to each of the diffusion layer 22D and the bit line BL2. Furthermore, the gate electrode 21, the bit line BL1, and the bit line BL2 each include, for example, a highly electrically-conductive material such as copper (Cu), and extend along a Y-axis direction (see FIG. 1B).

The semiconductor device 1 further includes a selection line SL2 as a third electrically-conductive section and a selection line SL1 as a fourth electrically-conductive section. The selection line SL2 is provided opposite to the storage element 30A as viewed from the diffusion layer 22S, and is electrically coupled to the diffusion layer 22S. The selection line SL1 is provided opposite to the storage element 30B as viewed from the diffusion layer 22D, and is electrically coupled to the diffusion layer 22D. Furthermore, the selection line SL2 and the selection line SL1 also include, for example, a highly electrically-conductive material such as copper (Cu), and extend along the Y-axis direction (see FIG. 1C) as with the gate electrode 21, the bit line BL1, and the bit line BL2.

The semiconductor device 1 is, for example, one in which a multilayer wiring formation section 40, an interlayer insulating layer 27, an interlayer insulating layer 26, the semiconductor substrate 10, and an insulating layer 60 are stacked in this order on a support substrate 50. The transistor 20 is provided in proximity to the main surface (a front surface) 10A of the semiconductor substrate 10. The storage element 30A and the storage element 30B are provided on the back surface 10B side of the semiconductor substrate 10 with the insulating layer 60 interposed between the semiconductor substrate 10 and the storage elements 30A and 30B. It is to be noted that the number of the transistors 20 to be provided on the semiconductor substrate 10 is not particularly limited. The number of the transistors 20 may be one, or may be two or more.

The semiconductor substrate 10 includes an element region R1 in which a portion of the transistor 20 is provided and an isolation region R2 that surrounds the element region R1. In the isolation region R2 of the semiconductor substrate 10, an element isolation layer 11 formed by, for example, STI (Shallow Trench Isolation), is provided. The element isolation layer 11 is, for example, an insulating layer including a silicon oxide film ($SiO_2$), and one surface thereof is exposed in the main surface 10A of the semiconductor substrate 10.

A portion of the semiconductor substrate 10 that occupies the element region R1 includes, for example, single-crystal silicon with a channel region and a pair of the diffusion layers 22S and 22D that constitute a portion of the transistor 20 formed thereon.

The back surface 10B of the semiconductor substrate 10 is covered with the insulating layer 60. The storage elements 30A and 30B are provided on a surface of the insulating layer 60 opposite to a surface thereof in contact with the back surface 10B, i.e., on an upper surface 60S of the insulating layer 60.

The element region R1 is further provided with a contact plug P1 as a first connection and a contact plug P2 as a second connection that each extend to penetrate the insulating layer 60. The contact plug P1 and the contact plug P2 include a material mainly containing, for example, low-resistance metal such as Cu (copper), W (tungsten), or aluminum (Al). Furthermore, around the low-resistance metal, a barrier metal layer including a single substance of Ti (titanium) or Ta (tantalum) or an alloy of them may be provided. The contact plug P1 and the contact plug P2 are each surrounded by the insulating layer 60, and are electrically isolated from each other. A lower end of the contact plug P1 is in contact with a silicide region 25S to be described later, and an upper end of the contact plug P1 is in contact with the storage element 30A. A lower end of the contact plug P2 is in contact with a silicide region 25D to be described later, and an upper end of the contact plug P2 is in contact with the storage element 30B. Therefore, the storage element 30A is electrically coupled to, of a source region, the silicide region 25S through the contact plug P1, and the storage element 30B is electrically coupled to, of a drain region, the silicide region 25D through the contact plug P2. It is to be noted that the contact plug P1 and the contact plug P2 are shaped to, for example, gradually become larger in occupation area from the silicide regions 25S and 25D toward the storage elements 30A and 30B.

The transistor 20 is a transistor for selection between the storage elements 30A and 30B, and is, for example, a planar transistor including the gate electrode 21 and the pair of the diffusion layers 22S and 22D serving as the source region and the drain region. The gate electrode 21 is coupled to a word line WL of the storage elements 30A and 30B.

The gate electrode 21 is provided on the main surface 10A of the semiconductor substrate 10. However, a gate insulating film 23 including a silicon oxide film, etc. is provided between the gate electrode 21 and the semiconductor substrate 10. A side wall 24 including, for example, a stacked film of a silicon oxide film 24A and a silicon nitride film 24B is provided on a side surface of the gate electrode 21.

The pair of the diffusion layers 22S and 22D includes, for example, silicon with an impurity diffused therein. Specifically, the diffusion layer 22S corresponds to the source region, and the diffusion layer 22D corresponds to the drain region. The pair of the diffusion layers 22S and 22D is provided across the channel region of the semiconductor substrate 10 opposed to the gate electrode 21. Respective portions of the diffusion layers 22S and 22D are provided with the silicide regions 25S and 25D including metal silicide, such as NiSi (nickel silicide) or CoSi (cobalt silicide). The silicide regions 25S and 25D reduce contact resistance between connection layers 28A to 28D to be described later and the diffusion layers 22S and 22D. One surface of each of the silicide regions 25S and 25D is exposed in the main surface 10A of the semiconductor substrate 10, and another surface thereof opposite to the one surface is covered with the insulating layer 60. Furthermore, the diffusion layers 22S and 22D and the silicide regions 25S and 25D are all desirably smaller in thickness than the element isolation layer 11.

The word line WL and the selection lines SL1 and SL2 are embedded in the interlayer insulating layer 27. Furthermore, the connection layers 28A to 28C are provided to penetrate the interlayer insulating layers 26 and 27. Here, the gate electrode 21 is coupled to the word line WL via the connection layer 28C. The silicide region 25S of the diffusion layer 22S serving as the source region is coupled to the selection line SL2 via the connection layer 28A as a source electrode. Furthermore, the silicide region 25D of the diffusion layer 22D serving as the drain region is coupled to the selection line SL1 via the connection layer 28B as a drain electrode. The connection layer 28A is a specific example corresponding to a "third connection" of the present disclosure, and the connection layer 28B is a specific example corresponding to a "fourth connection" of the present disclosure. It is to be noted that the selection line SL2 is coupled to a via V1 of a wiring line group 40A to be described later, and the selection line SL1 is coupled to a via V1 of a wiring line group 40B to be described later.

The multilayer wiring formation section 40 includes, for example, a stack of an interlayer insulating layer 41, an interlayer insulating layer 42, an interlayer insulating layer 43, and an interlayer insulating layer 44 in ascending order of distance from the transistor 20, with the wiring line groups 40A and 40B provided therein. The wiring line groups 40A and 40B both have a structure in which a metal layer M1, a metal layer M2, a metal layer M3, and a metal layer M4 are stacked. Here, the metal layer M1 is embedded in the interlayer insulating layer 41, the metal layer M2 is embedded in the interlayer insulating layer 42, the metal layer M3 is embedded in the interlayer insulating layer 43, and the metal layer M4 is embedded in the interlayer insulating layer 44. The wiring line groups 40A and 40B further include vias V1 to V4. The metal layer M1 and the metal layer M2 are coupled to each other by the via V2 that penetrates the interlayer insulating layer 42. Likewise, the metal layer M2 and the metal layer M3 are coupled to each other by the via V3 that penetrates the interlayer insulating layer 43, and the metal layer M3 and the metal layer M4 are coupled to each other by the via V4 that penetrates the interlayer insulating layer 44. As described above, the wiring line group 40A is coupled to the silicide region 25S of the diffusion layer 22S serving as the source region through the via V1, the selection line SL2, and the connection layer 28A. Furthermore, the wiring line group 40B is coupled to the silicide region 25D of the diffusion layer 22D serving as the drain region through the via V1, the selection line SL1, and the connection layer 28B. It is to be noted that a configuration of the multilayer wiring formation section 40 illustrated in FIG. 1A is an example and non-limiting.

The multilayer wiring formation section 40 is bonded to the support substrate 50. The support substrate 50 is a substrate including, for example, single crystal silicon. It is to be noted that material of the support substrate 50 is not particularly limited. Instead of single crystal silicon, the support substrate 50 may include another material such as $SiO_2$ or glass.

The insulating layer 60 is, as described above, provided to cover the semiconductor substrate 10. The insulating layer 60 may have a stacked structure of a first layer including, for example, a High-K (high-dielectric constant) film that is able to be formed at low temperatures, i.e., Hf oxide, $Al_2O_3$, Ru (ruthenium) oxide, Ta oxide, an oxide containing Al, Ru, Ta, or Hf and Si, a nitride containing Al, Ru, Ta, or Hf and Si, an oxynitride containing Al, Ru, Ta, or Hf and Si, or the like, a second layer including, for example, $SiO_2$, and a third layer including a material lower in relative dielectric constant (Low-K) than $SiO_2$.

The storage element 30A and the storage element 30B both have a stacked structure in which, for example, an electrically-conductive layer 31 as a lower electrode, a storage section 32, and an electrically-conductive layer 33 as an upper electrode are stacked in this order. The electrically-conductive layer 31 of the storage element 30A is coupled to the silicide region 25S through the contact plug P1. The electrically-conductive layer 31 of the storage element 30B is coupled to the silicide region 25D through the contact plug P2.

A back-surface interlayer film 71 is provided around the storage element 30A and the storage element 30B. Examples of a material of the back-surface interlayer film 71 include $SiO_2$, a Low-K (low dielectric constant) film, etc. An upper surface of the electrically-conductive layer 33 in the storage element 30A is in contact with a lower surface of the bit line BL1, and an upper surface of the electrically-conductive layer 33 in the storage element 30B is in contact with a lower surface of the bit line BL2. An insulating layer 72 fills around the bit line BL1 and the bit line BL2.

The storage sections 32 in the storage elements 30 are preferably, for example, spin-injection magnetization-reversal storage elements (STT-MTJ: spin transfer torque-magnetic tunnel junctions) that store information by reversing a magnetization direction of a storage layer to be described later by spin injection. The STT-MTJ enable high-speed reading and writing, thus showing promise as a non-volatile memory replacing a volatile memory.

The electrically-conductive layer 31 and the electrically-conductive layer 33 include, for example, a metal material such as Cu, Ti, W, or Ru. The electrically-conductive layer 31 and the electrically-conductive layer 33 preferably include mainly Cu, Al, or W, which is metal other than a constituent material of an underlayer 32A or a cap layer 32E to be described later. Furthermore, it is also possible for the electrically-conductive layer 31 and the electrically-conductive layer 33 to include Ti, TiN (titanium nitride), Ta, TaN (tantalum nitride), W, Cu, or Al, or a stacked structure of them.

FIG. 2 illustrates an example of a configuration of the storage section 32. The storage section 32 has a configuration in which, for example, there are stacked the underlayer 32A, a magnetization pinned layer 32B, an insulating layer 32C, a storage layer 32D, and the cap layer 32E in ascending order of distance from the electrically-conductive layer 31. That is, the storage elements 30 have a bottom pin structure including the magnetization pinned layer 32B, the insulating layer 32C, and the storage layer 32D in this order from bottom to top in a stacking direction. Information is stored by changing an orientation of a magnetization M32D of the storage layer 32D with uniaxial anisotropy. Information "0" or "1" is defined by a relative angle (parallel or antiparallel) between the magnetization M32D of the storage layer 32D and a magnetization M32B of the magnetization pinned layer 32B.

The underlayer 32A and the cap layer 32E include a film of metal, such as Ta or Ru, or a stacked film of them.

The magnetization pinned layer 32B is a reference layer that serves as a reference of stored information (the magnetization direction) of the storage layer 32D, and includes a ferromagnetic substance having a magnetic moment that pins a direction of the magnetization M32B in a direction perpendicular to a film surface. The magnetization pinned layer 32B includes, for example, Co—Fe—B.

It is undesirable that the direction of the magnetization M32B of the magnetization pinned layer 32B be changed by reading and writing; however, it does not always have to be pinned in a specific direction. One reason for this is that the direction of the magnetization M32B of the magnetization pinned layer 32B only has to be less likely to vary than a direction of the magnetization M32D of the storage layer 32D. For example, the magnetization pinned layer 32B only has to have a higher coercivity and a larger magnetic film thickness or have a larger magnetic damping constant than the storage layer 32D. To pin the direction of the magnetization M32B, for example, it is sufficient that an antiferromagnetic substance such as PtMn or IrMn is provided in contact with the magnetization pinned layer 32B. Alternatively, the direction of the magnetization M32B may be indirectly pinned by magnetically coupling a magnetic substance that is in contact with such an antiferromagnetic substance to the magnetization pinned layer 32B through a nonmagnetic substance such as Ru.

The insulating layer 32C is an intermediate layer that serves as a tunnel barrier layer (a tunnel insulating layer), and includes, for example, aluminum oxide or magnesium oxide (MgO). Among others, the insulating layer 32C preferably includes magnesium oxide. This enables an increase in magnetoresistance change rate (MR ratio) and improves the efficiency of spin injection, thereby making it possible to reduce a current density for reversing the orientation of the magnetization M32D of the storage layer 32D.

The storage layer 32D includes a ferromagnetic substance having a magnetic moment that allows the direction of the magnetization M32D to freely change to a direction perpendicular to the film surface. The storage layer 32D includes, for example, Co—Fe—B.

FIG. 3 illustrates an example of a configuration of each layer in the storage section 32 in more detail. The underlayer 32A has a configuration in which, for example, there are stacked a Ta layer having a thickness of 3 nm and an Ru film having a thickness of 25 nm in ascending order of distance from the electrically-conductive layer 31. The magnetization pinned layer 32B has a configuration in which, for example, there are stacked a Pt layer having a thickness of 5 nm, a Co layer having a thickness of 1.1 nm, an Ru layer having a thickness of 0.8 nm, and a (Co20Fe80)80B20 layer having a thickness of 1 nm in ascending order of distance from the electrically-conductive layer 31. The insulating layer 32C has a configuration in which, for example, there are stacked an Mg layer having a thickness of 0.15 nm, an MgO layer having a thickness of 1 nm, and an Mg layer having a thickness of 0.15 nm in ascending order of distance from the electrically-conductive layer 31. The storage layer 32D has, for example, a thickness t of 1.2 to 1.7 nm and includes a (Co20Fe80)80B20 layer. The cap layer 32E has a configuration in which, for example, there are stacked a Ta layer having a thickness of 1 nm, an Ru layer having a thickness of 5 nm, and a Ta layer having a thickness of 3 nm in ascending order of distance from the electrically-conductive layer 31.

The semiconductor device 1 further includes a controller CTRL (FIG. 3). The controller CTRL controls an electric potential of each of the selection line SL1, the selection line SL2, the bit line BL1, the bit line BL2, and the word line WL.

[Operation of Semiconductor Device 1]

In the semiconductor device 1, information is written into the storage layer 32D of the storage element 30A and the storage layer 32D of the storage element 30B in accordance with a magnitude relationship between respective electric potentials of the selection line SL1, the selection line SL2, the bit line BL1, the bit line BL2, and the word line WL. The electric potential of each of the selection line SL1, the selection line SL2, the bit line BL1, the bit line BL2, and the word line WL is controlled by the controller CTRL (FIG. 3).

Specifically, for example, as illustrated in FIG. 4A, the controller CTRL sets the electric potential of the bit line BL1 to a first potential (for example, Low), and sets the electric potential of the selection line SL1 to a second potential (High) higher than the first potential. This causes electrons $e^-$ to flow in the direction of the arrow, and first information "1" is thus written into the storage layer 32D of the storage element 30A. At this time, the controller CTRL sets the electric potential of the gate electrode 21, i.e., the word line WL to the second potential, and maintains the electric potential of the bit line BL2 and the electric potential of the selection line SL2 at a third potential independent of the electric potential of the bit line BL1, the electric potential of the selection line SL1, and the electric potential of the word line WL. That is, the controller CTRL brings the electric potential of the bit line BL2 and the electric potential of the selection line SL2 into a floating state. The controller CTRL may cause a high impedance circuit (Hi-Z circuit) included therein to perform floating control on the electric potential of the bit line BL2 and the electric potential of the selection line SL2.

For example, as illustrated in FIG. 4B, the controller CTRL sets the electric potential of the bit line BL1 to the second potential, and sets the electric potential of the selection line SL1 to the first potential. This causes electrons e⁻ to flow in the direction of the arrow, and second information "0" is thus written into the storage layer 32D of the storage element 30A. Also in that case, the controller CTRL sets the electric potential of the gate electrode 21, i.e., the word line WL to the second potential, and maintains the electric potential of the bit line BL2 and the electric potential of the selection line SL2 at the third potential independent of the electric potential of the bit line BL1, the electric potential of the selection line SL1, and the electric potential of the word line WL. That is, the controller CTRL brings the electric potential of the bit line BL2 and the electric potential of the selection line SL2 into a floating state.

For example, as illustrated in FIG. 4C, the controller CTRL sets the electric potential of the bit line BL2 to the first potential, and sets the electric potential of the selection line SL2 to the second potential. This causes electrons e⁻ to flow in the direction of the arrow, and the first information "1" is thus written into the storage layer 32D of the storage element 30B. In that case, the electric potential of the gate electrode 21, i.e., the word line WL is set to the second potential, and the electric potential of the bit line BL1 and the electric potential of the selection line SL1 are maintained at a fourth potential independent of the electric potential of the bit line BL2, the electric potential of the selection line SL2, and the electric potential of the word line WL. That is, the controller CTRL maintains the electric potential of the bit line BL1 and the electric potential of the selection line SL1 in a floating state.

For example, as illustrated in FIG. 4D, the controller CTRL sets the electric potential of the bit line BL2 to the second potential, and sets the electric potential of the selection line SL2 to the first potential. This causes electrons e⁻ to flow in the direction of the arrow, and the second information "0" is thus written into the storage layer 32D of the storage element 30B. Also in that case, the electric potential of the gate electrode 21, i.e., the word line WL is set to the second potential, and the electric potential of the bit line BL1 and the electric potential of the selection line SL1 are maintained at the fourth potential. That is, the controller CTRL maintains the electric potential of the bit line BL1 and the electric potential of the selection line SL1 in a floating state.

In accordance with the magnitude relationship between the respective electric potentials of the selection line SL1, the selection line SL2, the bit line BL1, the bit line BL2, and the word line WL, an electric current is applied in a direction perpendicular to the film surface of the storage section 32, which causes spin torque magnetization reversal to occur. Thus, writing of information is performed by making the orientation of the magnetization M32D of the storage layer 32D parallel or antiparallel to the magnetization M32B of the magnetization pinned layer 32B and thereby changing the resistance value of the storage section 32 to high or low.

Meanwhile, reading out information stored in the storage section 32 is made possible by providing a magnetic layer (not illustrated) that serves as a reference of information on the storage layer 32D with a thin insulating film interposed therebetween, and using a ferromagnetic tunnel current flowing via the insulating layer 32C. Furthermore, reading may also be performed by using a magnetoresistance effect.

[Workings and Effects of Semiconductor Device 1]

In the semiconductor device 1, the storage element 30A is coupled to the source region of the transistor 20, and the storage element 30B is coupled to the drain region of the transistor 20. Thus, the area occupied by the entire semiconductor device 1 is smaller than that is in a case where both the storage element 30A and the storage element 30B are coupled to, for example, the source region. For example, in a semiconductor device 1001 as a reference example illustrated in FIGS. 8A and 8B, both of two storage elements 1030A and 1030B located in the same hierarchy are coupled to a source region. In this case, a larger element region R1001 is necessary. It is to be noted that FIG. 8A is a cross-sectional diagram illustrating a configuration example of the semiconductor device 1001 as a reference example, and FIG. 8B illustrates a planar configuration example of the semiconductor device 1001. FIG. 8A corresponds to a cross section along a section line VIIIA-VIIIA illustrated in FIG. 8B, as viewed in a direction of arrows.

In contrast, according to the semiconductor device 1 of the present embodiment, it is possible to provide the transistor 20 and the storage elements 30A and 30B compactly in the narrower element region R1. This makes it possible to accommodate more transistors 20 and more storage elements 30A and 30B in a limited region in the semiconductor device 1 as a whole, thus enabling higher integration. Furthermore, if, for example, the storage element 30A is used for reading and writing at normal times and the storage element 30B is used for reading and writing in the event of any abnormality in the storage element 30A, it becomes possible to achieve redundancy. That is, it is possible to improve the operational reliability of the semiconductor device 1. Moreover, in the semiconductor device 1 of the present embodiment, the storage elements 30A and 30B are provided on the back surface 10B side of the semiconductor substrate 10, and therefore it is possible to prevent heat generated, for example, in a process of producing the transistor 20 or a wiring layer from affecting the storage elements 30A and 30B.

2. Second Embodiment

[Configuration of Semiconductor Device 2]

FIG. 5A illustrates a cross-sectional configuration of a semiconductor device 2 as a second embodiment of the present disclosure. Furthermore, both FIGS. 5B and 5C illustrate planar configurations of the semiconductor device 2. Note that FIG. 5B illustrates a planar configuration of the semiconductor device 2 as viewed from the main surface 10A side of the semiconductor substrate 10, and FIG. 5C illustrates a planar configuration of the semiconductor device 2 as viewed from the back surface 10B side of the semiconductor substrate 10. FIG. 5A corresponds to a cross-sectional view along a section line VA-VA illustrated in FIGS. 5B and 5C, as viewed in a direction of arrows.

In the semiconductor device 1 of the above-described first embodiment, the storage element 30A and the storage element 30B are provided on the back surface 10B side of the semiconductor substrate 10 opposite to the main surface 10A on which the transistor 20 is provided, with the insulating layer 60 interposed between the semiconductor substrate 10 and the storage elements 30A and 30B. In contrast, in the semiconductor device 2 according to the present embodiment, the storage element 30A and the storage element 30B are provided on the side of the main surface 10A, on which the transistor 20 is provided, of the semiconductor substrate 10. In the following description and FIGS. 5A, 5B, and 5C, components corresponding to those of the semiconductor device 1 according to the above-described first embodiment are assigned with the same reference signs.

In the semiconductor device 2 of the present embodiment, as compared with the semiconductor device 1, the respective positions at which the storage element 30A and the selection line SL2 are disposed are interchanged, and the respective positions at which the storage element 30B and the selection line SL1 are disposed are interchanged. Specifically, the selection line SL2 and the selection line SL1 are provided on the upper surface 60S of the insulating layer 60, a lower surface of the selection line SL2 is in contact with the contact plug P1, and a lower surface of the selection line SL1 is in contact with the contact plug P2. Meanwhile, the storage element 30A and the storage element 30B are embedded in the interlayer insulating layer 27, the storage element 30A is in contact with a lower surface of the connection layer 28A, and the storage element 30B is in contact with a lower surface of the connection layer 28B. Furthermore, in the semiconductor device 2, the bit line BL1 is disposed instead of the metal layer M4 in the wiring line group 40A of the semiconductor device 1, and the bit line BL2 is disposed instead of the metal layer M4 in the wiring line group 40B of the semiconductor device 1. That is, the bit line BL1 and the bit line BL2 are both provided on the support substrate 50, and their upper surfaces are in contact with lower surfaces of the vias V4 and are embedded in the interlayer insulating layer 44.

[Workings and Effects of Semiconductor Device 2]

Also in such a semiconductor device 2, similar effects to those of the semiconductor device 1 according to the above-described first embodiment are obtained. That is, in the semiconductor device 2, the storage element 30A is coupled to the source region in the transistor 20, and the storage element 30B is coupled to the drain region in the transistor 20. Thus, the area occupied by the entire semiconductor device 2 is smaller than, for example, that in a case where both the storage element 30A and the storage element 30B are coupled to the source region. This makes it possible to accommodate more transistors 20 and more storage elements 30A and 30B in a narrower region, thus enabling higher integration. Furthermore, in the semiconductor device 2, the storage element 30A and the storage element 30B are provided on the side of the main surface 10A on which the transistor 20 is provided, and therefore, it is sufficient that only the contact plugs P1 and P2 and wiring lines such as the selection lines SL1 and SL2 are disposed on the back surface 10B side. That is, it is possible to simplify a formation process on the back surface 10B side. Moreover, in the semiconductor device 2, the storage element 30A and the storage element 30B are embedded in the interlayer insulating layer 27 provided with the transistor 20; therefore, as compared with the semiconductor device 1 of the above-described first embodiment, it is easier to reduce the entire thickness.

3. Third Embodiment

[Configuration of Semiconductor Device 3]

FIG. 6A is a perspective diagram illustrating a configuration of a semiconductor device 3 as a third embodiment of the present disclosure. FIG. 6B illustrates the configuration of the semiconductor device 3, and corresponds to a cross section along a section line VIB-VIB illustrated in FIG. 6A, as viewed in a direction of arrows. The semiconductor device 3 has a configuration similar to that of the semiconductor device 1, except that the semiconductor device 3 includes a transistor 80 instead of the transistor 20. The transistor 80 is embedded in an element formation layer 80A provided between the support substrate 50 and a semiconductor substrate 13 including, for example, silicon. The semiconductor substrate 13 has a front surface 13A facing the element formation layer 80A, and a back surface 13B located opposite to the front surface 13A. The transistor 80 is provided on the front surface 13A side of the semiconductor substrate 13. The storage elements 30A and 30B are provided on the back surface 13B side. In the present embodiment, components corresponding to those of the semiconductor device 1 according to the above-described first embodiment are assigned with the same reference signs for description.

The transistor 80 is, for example, a fin field-effect transistor (Fin-FET) that includes: a fin 81 including Si (silicon); a gate electrode 82G; a source electrode 82S; and a drain electrode 82D. By using the Fin-FET, it becomes possible to suppress short-channel characteristics as compared with a planar transistor on a bulk substrate. The gate electrode 82G also serves as the word line WL of the storage element 30A and the storage element 30B.

The fin 81 has a shape of a flat plate, and includes a plurality of fins provided to stand on the semiconductor substrate 13 including, for example, silicon. The plurality of fins 81 extends, for example, in an X-axis direction, and is arranged in the Y-axis direction. Note that FIGS. 6A and 6B illustrate only a single fin 81. A cross section of the fin 81 perpendicular to the X-axis direction, i.e., a YZ-section has a shape of, for example, a trapezoid. The gate electrode 82G, the source electrode 82S, and the drain electrode 82D each extend astride the fin 81 in the Y-axis direction that intersects the extending direction of the fin 81. The gate electrode 82G, the source electrode 82S, and the drain electrode 82D each cover surfaces of the fin 81 other than a back surface, i.e., a surface of the fin 81 in contact with the semiconductor substrate 13. Here, an upper end of the source electrode 82S is coupled to the selection line SL2, and an upper end of the drain electrode 82D is coupled to the selection line SL1. It is to be noted that in FIG. 6A, illustrations of the selection line SL1 and the selection line SL2 are omitted to prevent the drawing from being intricate.

Furthermore, the fin 81 includes, in the proximity of its back surface, impurity diffused regions 83S and 83D serving as a source region and a drain region. The impurity diffused region 83S is coupled to the storage element 30A through the contact plug P1, and the impurity diffused region 83D is coupled to the storage element 30B through the contact plug P2.

[Workings and Effects of Semiconductor Device 3]

Also in such a semiconductor device 3, it is possible to expect effects similar to those of the semiconductor device 1 of the above-described first embodiment.

Furthermore, in the present embodiment, the transistor 80 that is a Fin-FET having a high current drive capability is mounted, and is used as a transistor for selection between the storage element 30A and the storage element 30B. This enables high-speed reading and writing of information.

[Configuration of Semiconductor Device 3A as Modification Example]

FIG. 6C is a cross-sectional diagram illustrating a configuration of a semiconductor device 3A as a modification example of the present embodiment, and corresponds to FIG. 6B. In the semiconductor device 3 as the third embodiment illustrated in FIGS. 6A and 6B, the storage elements 30A and 30B are provided on the back surface 13B side of the semiconductor substrate 13. In contrast, in the semiconductor device 3A as the present modification example, the storage elements 30A and 30B are provided on the front surface 13A side of the semiconductor substrate 13. Also in such a semiconductor device 3A, it is possible to expect effects similar to those of the semiconductor device 3 of the above-described third embodiment.

4. Application Example

FIG. 7A illustrates a schematic configuration of an imaging unit 101 in which a sensor device 100 and a semiconductor device 200 are bonded together. As the semiconductor device 200, the semiconductor devices 1 to 3 of the above-described first to third embodiments are usable.

The imaging unit 101 is, for example, a stacked image sensor device in which the sensor device 100 is stacked on the semiconductor device 200. A pixel section 110 is formed in the sensor device 100. The semiconductor device 200 is provided with a logic circuit 210 and a memory section 220.

In the pixel section 110 of the sensor device 100, unit pixels are two-dimensionally arranged and there are provided, for example, a backside-illumination imaging element (an imaging element 110S, see FIG. 2), a transfer transistor that transfers an electrical charge obtained through photoelectric conversion by the imaging element 110S to a floating diffusion (FD) section, a reset transistor that resets an electric potential of the FD section, an amplification transistor that outputs a signal corresponding to the electric potential of the FD section, etc.

The semiconductor device 200 is provided with the logic circuit 210, such as a control circuit that controls the operation of the imaging element 110S, and non-volatile memory elements (the storage elements 30A and 30B) included in the memory section 220. It is to be noted that besides the logic circuit 210 and the memory section 220, the semiconductor device 200 may be equipped with, for example, a circuit having an image processing function, an ADC (Analog digital converter) circuit that converts an analog signal outputted from a unit pixel provided in the pixel section into a digital signal and outputs the digital signal, etc.

FIG. 7B illustrates an example of a specific cross-sectional configuration of the imaging unit 101 illustrated in FIG. 7A. The sensor device 100 in the imaging unit 101 is provided with the imaging element 110S as described above. The imaging element 110S is, for example, one in which a planarization layer 114, a color filter 115, and a microlens 116 are stacked in this order on a semiconductor substrate 113 with a photodiode 113A and a transistor 113B embedded therein. In the sensor device 100, a protective layer 117 is provided on the microlens 116 of the imaging element 110S, and a glass substrate 118 is provided on the protective layer 117. Furthermore, the sensor device 100 includes an electrically-conductive film 111 including, for example, Cu in its lowermost layer (its surface facing the semiconductor device 200), and an insulating layer 112 that occupies around the electrically-conductive film 111. A lower surface of the electrically-conductive film 111 is coupled to a connection layer P3 provided in an uppermost layer of the semiconductor device 200. The connection layer P3 includes, for example, copper or the like, and an insulating layer 73 occupies therearound.

The imaging unit 101 illustrated in FIGS. 7A and 7B makes it possible to achieve higher integration because any of the semiconductor devices 1 to 3 of the above-described first to third embodiments is applied as the semiconductor device 200.

The present disclosure has been described hereinabove with reference to the embodiments, etc.; however, the present disclosure is not limited to the foregoing embodiments, and may be modified in a variety of ways.

For example, the foregoing embodiments, etc. have been described with reference to specific configurations of the transistors 20 and 80 and the storage elements 30A and 30B; however, they do not have to include all of the components, and may further include other components.

Furthermore, the foregoing first embodiment has been described with reference to an example in which the transistor 20 is an NMOS transistor; however, the present disclosure is not limited thereto and, for example, a PMOS transistor is applicable. For example, a semiconductor device 1A illustrated in FIGS. 9A and 9B includes a PMOS transistor 20A. In this case, for example, as illustrated in FIG. 9A, the electric potential of the bit line BL1 is set to the first potential (for example, Low), and the electric potential of the selection line SL1 is set to the second potential (High) higher than the first potential. This causes electrons $e^-$ to flow in a direction of the arrow, and the second information "0" is written into the storage layer 32D of the storage element 30A. Meanwhile, if the electric potential of the bit line BL1 is set to the second potential and the electric potential of the selection line SL1 is set to the first potential as illustrated in FIG. 9B, electrons $e^-$ flow in a direction of the arrow, and the first information "1" is written into the storage layer 32D of the storage element 30A.

Moreover, in the foregoing embodiments, etc., the storage element having a bottom pin structure is described; however, the present technology may employ a storage element having a top pin structure. As used herein, the top pin structure refers to a structure in which a storage layer, an insulating layer, and a magnetization pinned layer are stacked in this order from bottom to top in the stacking direction. Note that in a case where the storage element has the top pin structure, its behavior is opposite to that in a case where the storage element has the bottom pin structure (High and Low to be written into the storage element are inverted).

It is to be noted that the effects described herein are merely examples and the description thereof is non-limiting. Any other effects may also be achieved. Furthermore, the present technology may have the following configurations.

(1)

A semiconductor device including:

a transistor including a gate section, a first diffusion layer, and a second diffusion layer;

a first electrically-conductive section;

a second electrically-conductive section that is electrically insulated from the first electrically-conductive section;

a first storage element that is located between the first diffusion layer and the first electrically-conductive section and is electrically coupled to each of the first diffusion layer and the first electrically-conductive section; and a second storage element that is located between the second diffusion layer and the second electrically-conductive section and is electrically coupled to each of the second diffusion layer and the second electrically-conductive section.

(2)

The semiconductor device according to (1), further including:

a third electrically-conductive section that is provided opposite to the first storage element as viewed from the first diffusion layer and is electrically coupled to the first diffusion layer; and a fourth electrically-conductive section that is provided opposite to the second storage element as viewed from the second diffusion layer and is electrically coupled to the second diffusion layer.

(3)

The semiconductor device according to (1) or (2), in which the gate section, the first electrically-conductive section, and the second electrically-conductive section all extend along a first direction.

(4)

The semiconductor device according to (2), in which the gate section and the first to fourth electrically-conductive sections all extend along a first direction.

(5)

The semiconductor device according to any one of (1) to (4), further including a semiconductor substrate having a first surface on which the gate section is provided, and a second surface located opposite to the first surface, in which the first diffusion layer constitutes a portion of the semiconductor substrate, being in proximity to the first surface, and the second diffusion layer constitutes another portion of the semiconductor substrate, being in proximity to the first surface.

(6)

The semiconductor device according to (5), further including:

a first insulating layer that covers the second surface of the semiconductor substrate; and a first connection and a second connection that each penetrate the first insulating layer, in which the first storage element and the second storage element are each provided opposite to the second surface as viewed from the first insulating layer, the first storage element is electrically coupled to the first diffusion layer through the first connection, and the second storage element is electrically coupled to the second diffusion layer through the second connection.

(7)

The semiconductor device according to (6), further including:

a second insulating layer that covers the first surface of the semiconductor substrate;

a third electrically-conductive section and a fourth electrically-conductive section each provided opposite to the second surface as viewed from the second insulating layer;

a third connection that penetrates the second insulating layer and electrically couples the first diffusion layer and the third electrically-conductive section to each other; and a fourth connection that penetrates the second insulating layer and electrically couples the second diffusion layer and the fourth electrically-conductive section to each other.

(8)

The semiconductor device according to (7), further including a controller that performs control to:

set an electric potential of the first electrically-conductive section to a first potential, an electric potential of the fourth electrically-conductive section to a second potential higher than the first potential, an electric potential of the gate section to the second potential, and an electric potential of the second electrically-conductive section and an electric potential of the third electrically-conductive section to a third potential independent of all of the electric potential of the first electrically-conductive section, the electric potential of the fourth electrically-conductive section, and the electric potential of the gate section to thereby write first information into the first storage element; and set the electric potential of the first electrically-conductive section to the second potential, the electric potential of the fourth electrically-conductive section to the first potential, the electric potential of the gate section to the second potential, and the electric potential of the second electrically-conductive section and the electric potential of the third electrically-conductive section to the third potential to thereby write second information into the first storage element.

(9)

The semiconductor device according to (8), in which the controller includes a potential control circuit that is able to maintain the electric potential of the second electrically-conductive section and the electric potential of the third electrically-conductive section at the third potential.

(10)

The semiconductor device according to (7), further including a controller that performs control to:

set an electric potential of the second electrically-conductive section to a first potential, an electric potential of the third electrically-conductive section to a second potential higher than the first potential, an electric potential of the gate section to the second potential, and an electric potential of the first electrically-conductive section and an electric potential of the fourth electrically-conductive section to a fourth potential independent of all of the electric potential of the second electrically-conductive section, the electric potential of the third electrically-conductive section, and the electric potential of the gate section to thereby write first information into the second storage element; and set the electric potential of the second electrically-conductive section to the second potential, the electric potential of the third electrically-conductive section to the first potential, the electric potential of the gate section to the second potential, and the electric potential of the first electrically-conductive section and the electric potential of the fourth electrically-conductive section to the fourth potential to thereby write second information into the second storage element.

(11)

The semiconductor device according to (10), in which the controller includes a potential control circuit that is able to maintain the electric potential of the first electrically-conductive section and the electric potential of the fourth electrically-conductive section at the fourth potential.

(12)

The semiconductor device according to any one of (5) to (11), further including:

a first insulating layer that covers the first surface of the semiconductor substrate;

a first connection and a second connection that each penetrate the first insulating layer;

a third electrically-conductive section that is provided opposite to the first surface as viewed from the first insulating layer and is electrically coupled to the first diffusion layer through the first connection; and a fourth electrically-conductive section that is provided opposite to the first surface as viewed from the first insulating layer and is electrically coupled to the second diffusion layer through the second connection.

(13)

The semiconductor device according to (12), further including:

a second insulating layer that covers the second surface of the semiconductor substrate; and a third connection and a fourth connection that each penetrate the second insulating layer, in which the first electrically-conductive section is provided opposite to the second insulating layer as viewed from the first storage element and is electrically coupled to the first diffusion layer through the third connection, and the second electrically-conductive section is provided opposite to the second insulating layer as viewed from the second storage element and is electrically coupled to the second diffusion layer through the fourth connection.

(14)

The semiconductor device according to (1), further including a fin that includes a semiconductor material and extends in a second direction intersecting the first direction, in which the first storage element and the second storage element are each coupled to a back surface of the fin, and the gate section, the first diffusion layer, and the second diffusion layer extend in the first direction, and cover surfaces of the fin other than the back surface.

(15)

An imaging unit including:

a semiconductor device; and an imaging element stacked on the semiconductor device, the semiconductor device including a transistor including a gate section, a first diffusion layer, and a second diffusion layer, a first electrically-conductive section, a second electrically-conductive section that is electrically insulated from the first electrically-conductive section, a first storage element that is located between the first diffusion layer and the first electrically-conductive section and is electrically coupled to each of the first diffusion layer and the first electrically-conductive section, and a second storage element that is located between the second diffusion layer and the second electrically-conductive section and is electrically coupled to each of the second diffusion layer and the second electrically-conductive section.

This application claims priority from Japanese Patent Application JP2018-39217 filed with the Japan Patent Office on Mar. 6, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device, comprising:
a transistor that includes:
a gate section;
a first diffusion layer;
a first silicide region in contact with the first diffusion layer;
a second diffusion layer; and
a second silicide region in contact with the second diffusion layer;
a first electrically-conductive section;
a second electrically-conductive section electrically insulated from the first electrically-conductive section;
a first storage element between the first diffusion layer and the first electrically-conductive section, wherein the first storage element is electrically coupled to each of the first diffusion layer and the first electrically-conductive section;
a second storage element between the second diffusion layer and the second electrically-conductive section, wherein the second storage element is electrically coupled to each of the second diffusion layer and the second electrically-conductive section;
a first insulating layer on the transistor;
a first connection plug in contact with each of the first silicide region of the transistor and the first storage element; and
a second connection plug in contact with each of the second silicide region of the transistor and the second storage element, wherein
each of the first connection plug and the second connection plug penetrates the first insulating layer.

2. The semiconductor device according to claim 1, further comprising:
a third electrically-conductive section opposite to the first storage element as viewed from the first diffusion layer, wherein the third electrically-conductive section is electrically coupled to the first diffusion layer; and
a fourth electrically-conductive section opposite to the second storage element as viewed from the second diffusion layer, wherein the fourth electrically-conductive section is electrically coupled to the second diffusion layer.

3. The semiconductor device according to claim 1, wherein the gate section, the first electrically-conductive section, and the second electrically-conductive section extend along a first direction.

4. The semiconductor device according to claim 2, wherein the gate section, the first electrically-conductive section, the second electrically-conductive section, the third electrically-conductive section, and the fourth electrically-conductive section extend along a first direction.

5. The semiconductor device according to claim 1, further comprising a semiconductor substrate, wherein
the semiconductor substrate includes:
a first surface, wherein the gate section is on the first surface; and
a second surface opposite to the first surface,
the semiconductor substrate includes the first diffusion layer and the second diffusion layer within proximity to the first surface.

6. The semiconductor device according to claim 5, wherein
the first insulating layer covers the second surface of the semiconductor substrate
each of the first storage element and the second storage element is opposite to the second surface as viewed from the first insulating layer,
the first storage element is electrically coupled to the first diffusion layer through the first connection plug, and
the second storage element is electrically coupled to the second diffusion layer through the second connection plug.

7. The semiconductor device according to claim 6, further comprising:
a second insulating layer that covers the first surface of the semiconductor substrate;
a third electrically-conductive section and a fourth electrically-conductive section, wherein each of the third electrically-conductive section and the fourth electrically-conductive section is opposite to the second surface as viewed from the second insulating layer;
a third connection plug that penetrates the second insulating layer, wherein the third connection plug is configured to electrically couple, the first diffusion layer to the third electrically-conductive section; and
a fourth connection plug that penetrates the second insulating layer, wherein the fourth connection plug is configured to electrically couple the second diffusion layer to the fourth electrically-conductive section.

8. The semiconductor device according to claim 7, further comprising a controller configured to one of:
set an electric potential of the first electrically-conductive section to a first potential, an electric potential of the fourth electrically-conductive section to a second potential higher than the first potential, an electric potential of the gate section to the second potential, and an electric potential of the second electrically-conductive section and an electric potential of the third electrically-conductive section to a third potential independent of each of the electric potential of the first electrically-conductive section, the electric potential of the fourth electrically-conductive section, and the electric potential of the gate section to thereby write first information to the first storage element, or
set the electric potential of the first electrically-conductive section to the second potential, the electric potential of the fourth electrically-conductive section to the first potential, the electric potential of the gate section to the second potential, and the electric potential of the second electrically-conductive section and the electric potential of the third electrically-conductive section to the third potential to thereby write second information into the first storage element.

9. The semiconductor device according to claim 8, wherein
the controller includes a potential control circuit, and
the potential control circuit is configured to maintain the electric potential of the second electrically-conductive section and the electric potential of the third electrically-conductive section at the third potential.

10. The semiconductor device according to claim 7, further comprising a controller configured to one of:
set an electric potential of the second electrically-conductive section to a first potential, an electric potential of the third electrically-conductive section to a second potential higher than the first potential, an electric potential of the gate section to the second potential, and an electric potential of the first electrically-conductive section and an electric potential of the fourth electrically-conductive section to a fourth potential independent of all of the electric potential of the second electrically-conductive section, the electric potential of the third electrically-conductive section, and the electric potential of the gate section to thereby write first information into the second storage element, or
set the electric potential of the second electrically-conductive section to the second potential, the electric potential of the third electrically-conductive section to the first potential, the electric potential of the gate section to the second potential, and the electric potential of the first electrically-conductive section and the electric potential of the fourth electrically-conductive section to the fourth potential to thereby write second information into the second storage element.

11. The semiconductor device according to claim 10, wherein
the controller includes a potential control circuit, and
the potential control circuit is configured to maintain the electric potential of the first electrically-conductive section and the electric potential of the fourth electrically-conductive section at the fourth potential.

12. The semiconductor device according to claim 1, further comprising a fin that includes a semiconductor material, wherein
the fin extends in a second direction intersecting a first direction,
each of the first storage element and the second storage element is coupled to a back surface of the fin, and
the gate section, the first diffusion layer, and the second diffusion layer extend in the first direction, and cover surfaces of the fin other than the back surface.

13. An imaging unit, comprising:
a semiconductor device; and
an imaging element on the semiconductor device, wherein
the semiconductor device includes:
a transistor that includes:
a gate section;
a first diffusion layer;
a first silicide region in contact with the first diffusion layer;
a second diffusion layer; and
a second silicide region in contact with the second diffusion layer;
a first electrically-conductive section;
a second electrically-conductive section electrically insulated from the first electrically-conductive section;
a first storage element between the first diffusion layer and the first electrically-conductive section, wherein the first storage element is electrically coupled to each of the first diffusion layer and the first electrically-conductive section;
a second storage element between the second diffusion layer and the second electrically-conductive section, wherein the second storage element is electrically coupled to each of the second diffusion layer and the second electrically-conductive section;
a first insulating layer on the transistor;
a first connection plug in contact with each of the first silicide region of the transistor and the first storage element; and
a second connection plug in contact with each of the second silicide region of the transistor and the second storage element, wherein
each of the first connection plug and the second connection plug penetrates the first insulating layer.

* * * * *